(12) United States Patent
Takahashi

(10) Patent No.: US 7,196,407 B2
(45) Date of Patent: Mar. 27, 2007

(54) SEMICONDUCTOR DEVICE HAVING A MULTI-CHIP STACKED STRUCTURE AND REDUCED THICKNESS

(75) Inventor: Nobuaki Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/070,089

(22) Filed: Mar. 3, 2005

(65) Prior Publication Data
US 2005/0194694 A1 Sep. 8, 2005

(30) Foreign Application Priority Data
Mar. 3, 2004 (JP) .............................. 2004-059885

(51) Int. Cl.
*H01L 23/02* (2006.01)
(52) U.S. Cl. .................................... 257/686
(58) Field of Classification Search ........ 257/686–690, 257/777, 700
See application file for complete search history.

(56) References Cited

U.S. PATENT DOCUMENTS 6,005,778 A * 12/1999 Spielberger et al. ........ 361/770
6,621,169 B2 * 9/2003 Kikuma et al. ............. 257/780
6,861,288 B2 * 3/2005 Shim et al. ................. 438/109
2004/0061213 A1 * 4/2004 Karnezos .................... 257/686
2005/0029645 A1 * 2/2005 Mess et al. ................. 257/686

FOREIGN PATENT DOCUMENTS

JP 2000-252408 9/2000
JP 2003-101000 4/2003

\* cited by examiner

*Primary Examiner*—Nathan W. Ha
(74) *Attorney, Agent, or Firm*—Young & Thompson

(57) ABSTRACT

A semiconductor device comprising the multi-chip stack structure that involves improved degree of freedom in routing arrangement and has reduced thickness is provided. A semiconductor device, comprising: a substrate; a lower semiconductor chip provided on the substrate; an upper semiconductor chip provided on the lower semiconductor chip; and a silicon spacer with a rerouting disposed between the lower semiconductor chip and the upper semiconductor chip, and including a protruding portion protruding farther outward than an outer periphery of the lower semiconductor chip, is provided. Second electrode pads provided on the protruding portion and first electrode pads provided on the lower semiconductor chip are connected via interconnects including through electrodes of the silicon spacer with the rerouting.

8 Claims, 12 Drawing Sheets ature text
SEMICONDUCTOR DEVICE HAVING A MULTI-CHIP STACKED STRUCTURE AND REDUCED THICKNESS The present application is based on Japanese Patent Application NO. 2004-059885, the whole disclosure of which is hereby incorporated by reference.

BACKGROUND OF THE INVENTION

1. Field of the Invention

The present invention relates to a semiconductor device.

2. Related Art

In recent years, with the view of achieving an even higher degree of package that is formed of a semiconductor chip in a longitudinal direction, development of three-dimensional implementation of semiconductor chips such as an LSI has lately been vigorously carried out. Such attempts include a technique disclosed in JP-A Laid Open No. 2003-101,000. A semiconductor device described therein is shown in FIG. 11. FIG. 11 is a schematic cross-sectional view showing a multi-chip stack structure based on a conventional silicon spacer.

A semiconductor device 1100 comprises a semiconductor chip 1104 and a semiconductor chip 1106 on a substrate 1102. A silicon spacer 1108 is interposed between the semiconductor chip 1104 and the semiconductor chip 1106.

The semiconductor chip 1104 is provided with electrode pads 1114a and 1114b on the upper surface thereof, and is connected to electrode pads 1112b and 1112c, which are provided on the upper surface of the substrate 1102, through wires 1120c and 1120b, respectively.

The semiconductor chip 1106 is provided with electrode pads 1116a and 1116b on the upper surface thereof, and is connected to electrode pads 1112a and 1112d, which are provided on the upper surface of the substrate 1102; through wires 1120d and 1120a, respectively.

JP-A Laid Open No. 2003-101,000 describes that a gap or a space can be provided between the lower semiconductor chip 1104 and the upper semiconductor chip 1106 due to a presence of a silicon spacer 1108, and consequently, a wire bonding can be performed on the lower semiconductor chip 1104.

JP-A Laid Open No. 2003-101,000 also describes that such structure is particularly effective in a case where the upper semiconductor chip 1106 is larger than the lower semiconductor chip 1104, or in a case where the chip sizes of both are nearly equivalent.

In addition, another example of such technique is disclosed in JP-A Laid Open No. 2000-252,408. A semiconductor device disclosed therein is shown in FIG. 12. FIG. 12 is a schematic cross-sectional view showing a conventional chip-on-chip structure employing insulating films.

The chip-on-chip structure includes a first semiconductor chip 411 and a second semiconductor chip 417. Between the first semiconductor chip 411 and the second semiconductor chip 417, an insulating film 414 is interposed. The insulating film 414 includes a structure that an interconnect pattern 416 and an interconnect pattern 420 are provided on a film 415.

The interconnect pattern 416 is provided with a connection portion 423 at a lower surface thereof. The connection portion 423 is connected to a bump 413a of the first semiconductor chip, formed on a surface 412 of the first semiconductor chip. The interconnect pattern 416 is also provided with a connection portion 424 on an upper surface thereof. The connection interface 424 is connected to a bump 419a of the second semiconductor chip, formed on a surface 418 of the second semiconductor chip.

The interconnect pattern 416 is provided with a connection portion 423 at a lower surface thereof. The connection portion 423 is connected to a bump 413a of the first semiconductor chip, formed on a surface 412 of the first semiconductor chip. The interconnect pattern 416 is also provided with a connection portion 424 on an upper surface thereof. The connection portion 424 is connected to a bump 419a of the second semiconductor chip, formed on a surface 418 of the second semiconductor chip.

According to JP-A Laid Open No. 2000-252,408, the described structure enables stacking and connecting semiconductor chips that have different intervals between electrodes and/or different electrode positions, thereby offering a higher degree of freedom in designing a chip-on-chip type semiconductor device.

SUMMARY OF THE INVENTION

However, it has now been discovered that the techniques disclosed in the cited documents have the following drawbacks.

Firstly, in the semiconductor device 1100 described in JP-A Laid Open No. 2003-101,000 requires to have a thicker silicon spacer 1108 so as to perform a wire bonding over the electrode pads 1114a and 1114b disposed on the lower semiconductor chip 1104, since a gap having a certain dimension for a loop height of an Au wire is necessary. Consequently, total thickness of the whole semiconductor device 1100 becomes larger, and thus it may be difficult to achieve higher integration of the semiconductor chips.

Secondly, the chip-on-chip structure described in JP-A Laid Open No. 2000-252,408 is difficult to be applied in the wire bonding technique, because the insulating film 414 has insufficient rigidity. In addition, the insufficient rigidity of the insulating film 414 may provide insufficient dimensional stability during the manufacturing process.

According to the present invention, there is provided a semiconductor device, comprising: a substrate; a first semiconductor chip provided on the substrate; a second semiconductor chip provided on the first semiconductor chip; and a plate-shaped spacer formed between the first semiconductor chip and the second semiconductor chip, and including a protruding portion protruding farther outward than an outer periphery of the first semiconductor chip, wherein a first electrode pad is provided on the first semiconductor chip, and wherein the spacer includes a second electrode pad provided on the protruding portion and an interconnect that connects the first electrode pad and the second electrode pad.

According to the present invention, since the interconnect that connects the first electrode pad and the second electrode pad is provided in the spacer, the electrode pad on the upper surface of the first semiconductor chip is formed in the farther outer position than the outer periphery of the first semiconductor chip, even in the case where the spacer is thinner.

In addition, according to the present invention, the plate-shaped spacer having sufficient rigidity, since the semiconductor device includes the second electrode pad on the protruding portion of the spacer can be connected to a desired position with a suitable connecting technique such as wire bonding and the like. Such configuration provides the semiconductor device providing improved degree of freedom in routing arrangement and improved manufacturing stability and reliability.

Therefore, according to the present invention, the semiconductor device comprising the multi-chip stack structure having higher degree of freedom in routing arrangement and having sufficiently reduced thickness is offered.

While the present invention has been described as above, it is to be understood that any combination of the present invention is also included in the scope of the present invention. In addition, any conversion of the expressions included in the present invention into another category is also duly included in the scope of the present invention.

For example, the semiconductor device including the multi-chip stack structure according to the present invention may include two or more levels of semiconductor chips, without limiting to a two-levels stack structure. Specifically, the stack structure may include three levels or four levels, for example.

According to the present invention, since the plate-shaped spacer comprising the interconnect having the specific structure is provided, the semiconductor device comprising the multi-chip stack structure having higher degree of freedom in routing arrangement and having sufficiently reduced thickness is offered.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1:
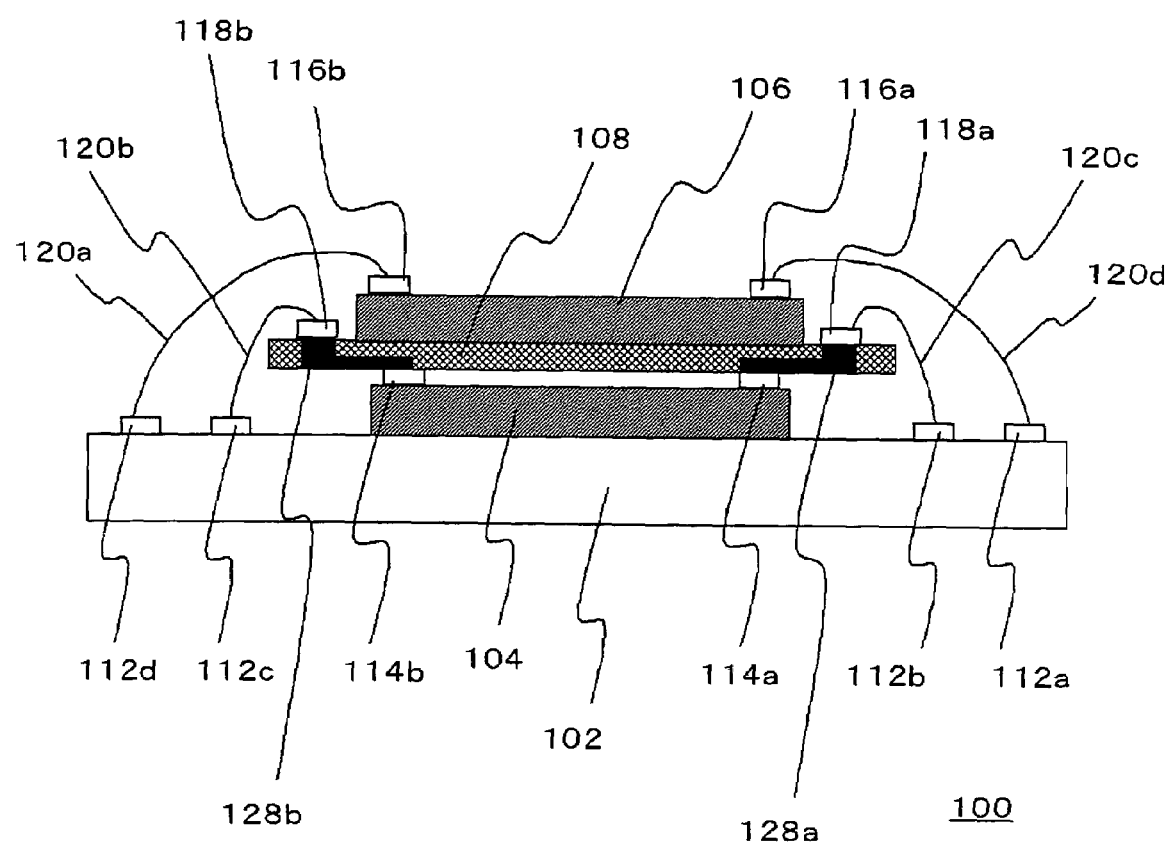
FIG. 1 is a schematic cross-sectional view showing a multi-chip stack structure according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In the present invention, the interconnect of the spacer may include a through electrode that penetrates the spacer.

According to the configuration, the interconnect of the above-described spacer may connect the first electrode pad on the upper surface of the first semiconductor chip and the second electrode pad of the protruding portion of the above-described spacer in a shorter path via the through electrode. Thus, such configuration may improve the signal transmission speed between the semiconductor chips.

The second electrode pad may be provided farther outward than an outer periphery of the second semiconductor chip.

According to the configuration, a more extensive space is secured around the second electrode pad, which improves the degree of freedom in arranging the connection to the second electrode pad.

The second electrode pad may be provided on the protruding portion.

According to the configuration, an open space is provided above the second electrode pad, which further improves the degree of freedom in arranging connection to the second electrode pad. For example, a wire bonding can be suitably performed.

The spacer may be a silicon substrate.

According to the configuration, since the silicon substrate has sufficient rigidity, the second electrode pad on the protruding portion of the spacer may be connected to a desired position by a suitable connecting technique such as wire bonding and the like. Such configuration provides the semiconductor device having improved degree of freedom in routing arrangement and improved manufacturing stability and reliability.

Also, when the first semiconductor chip and the second semiconductor chip are the silicon semiconductor chips, a linear expansion coefficient of the silicon substrate is substantially the same as that of the first semiconductor chip or the second semiconductor chip, and thus such configuration inhibits separation that is caused by temperature variation, thereby increasing the reliability of the semiconductor device.

The second electrode pad may be connected via wire bonding.

The semiconductor device thus constructed allows connecting the second electrode pad to a desired position by wire bonding, thereby increasing the degree of freedom in selecting a position to which the second electrode pad is to be connected.

Also, in the present invention, the semiconductor device may further comprise a reinforcing component formed on the substrate, for sustaining the spacer at the protruding portion.

According to the configuration, the protruding portion of the spacer obtains an increased strength, which allows connecting the second electrode pad on the protruding portion of the spacer in a desired position with wire bonding or the like. Such configuration provides the semiconductor device having improved degree of freedom in routing arrangement and improved manufacturing stability and reliability.

A third electrode may also be provided on an upper surface of the substrate, and wherein the second electrode pad may be connected to the third electrode pad with wire bonding.

The semiconductor device thus constructed allows disposing the first electrode pad of the first semiconductor chip at a farther outer position than an outer periphery of the first semiconductor chip, thereby facilitating connection thereof via the second electrode pad to the third electrode pad on the substrate by wire bonding, even in the case of having thinner spacer. Therefore, the semiconductor device comprising sufficiently thin multi-chip stack structure is offered.

A fourth electrode pad may be provided on an upper surface of the second semiconductor substrate, and the second electrode pad may be connected to the fourth electrode pad with wire bonding.

The semiconductor device thus constructed allows disposing the first electrode pad of the first semiconductor chip at a farther outer position than an outer periphery of the first semiconductor chip, thereby facilitating connection thereof via the second electrode pad to the fourth electrode pad on the second semiconductor chip with wire bonding, even in the case of having thinner spacer. Therefore, the semiconductor device comprising sufficiently thin multi-chip stack structure is offered.

The semiconductor device thus constructed allows having a shorter wire length, as compared with wire bonding from the fourth electrode pad of the above-described second semiconductor chip to the third electrode pad of the substrate, thereby providing improved signal transmission speed. In addition, since the shorter length of the wire can be employed, the width of the whole multi-chip stack structure can be reduced.

Also, a fifth electrode may be provided on an upper surface of the first semiconductor chip, a sixth electrode may be provided on a lower surface of the second semiconductor chip, and the spacer may include an interconnect that connects the fifth electrode pad and the sixth electrode pad.

According to the configuration, the fifth electrode pad of first semiconductor chip and sixth electrode pad of the second semiconductor chip are connected through an interconnect provided in the spacer in a face down arrangement, the thickness of the whole semiconductor device can be reduced, thereby providing improved signal transmission speed between the semiconductor chips. In addition, since it is not necessary to conduct wire bonding, the width of the whole multi-chip stack structure can be reduced.

Hereunder, description will be given regarding embodiments of the present invention, with reference to the accompanying drawings. Throughout the drawings, similar constituents will be given an identical numeral, and description thereof will not be presented.

First Embodiment

FIG. 1 is a schematic cross-sectional view showing a multi-chip stack structure according to the first embodiment.

A semiconductor device 100 includes a substrate 102, on which a semiconductor chip 104 and a semiconductor chip 106 are provided. Between the semiconductor chip 104 and the semiconductor chip 106, a silicon spacer 108 having a rerouting is interposed.

Here, although kinds or natures of the semiconductor chip 104 and the semiconductor chip 106 are not specifically limited, a silicon chip constituted of a similar material to that of the silicon spacer 108 may be employed for these silicon chips.

The substrate 102 is provided with electrode pads 112a, 112b, 112c and 112d on an upper surface of the substrate 102. The semiconductor chip 104 is provided with bump electrodes 114a and 114b on an upper surface of the semiconductor chip 104. The semiconductor chip 106 is provided with electrode pads 116a and 116b on an upper surface of the semiconductor chip 106.

The silicon spacer 108 includes through electrodes 128a and 128b penetrating the silicon spacer 108. On an upper surface of the silicon spacer 108, electrode pads 118a and 118b are provided. The electrode pad 118a is connected to an upper (outer) end portion of the through electrode 128a. The electrode pad 118b is connected to an upper (outer) end portion of the through electrode 128b.

Bump electrodes 114a and 114b of the lower semiconductor chip 104 are directly connected to the lower (inner) end portion of the through electrodes 128a and 128b of the silicon spacer 108, respectively.

The electrode pads 118a and 118b of the silicon spacer 108 are connected to the electrode pad 112b and 112c provided on the upper surface of the substrate 102 via wires 120c and 120b, respectively.

The electrode pads 116a and 116b of the semiconductor chip 106 are connected to the electrode pads 112a and 112d provided on the upper surface of the substrate 102 via wires 120d and 120a, respectively.

More specifically, in the present embodiment, the silicon spacer 108, which has larger dimension than the lower semiconductor chip 104 or the upper semiconductor chip 106, is interposed between the semiconductor chips 104 and 106 that are stacked. Accordingly, the bump electrodes 114a and 114b can be respectively drawn out to the electrode pads 118a and 118b on both sides of the semiconductor device 100.

Such configuration of the present embodiment allows performing wire bonding between the electrode pads 118a and 118b provided on the silicon spacer 108 and the electrode pads 112b and 112c on the substrate 102 respectively, thus to achieve connection between the lower semiconductor chip 104 and the substrate 102.

In addition, the electrode pads 116a and 116b on the upper surface of the upper semiconductor chip 106 can be connected to the electrode pads 112a and 112b on the upper surface of the substrate 102 via wire bonding, respectively, to achieve connection between the upper semiconductor chip 106 and the substrate 102.

In such configuration, the bump electrodes 114a and 114b disposed on the upper surface of the lower semiconductor chip 104 can be drawn out to the electrode pad 118a and 118b on the upper (outer) surface of the silicon spacer 108 via the through electrodes 128a and 128b provided in the silicon spacer 108, respectively.

Accordingly, wire bonding onto the lower semiconductor chip 104 can be conducted via the electrode pad 118a and 118b on the silicon spacer 108, which has larger dimension than the lower semiconductor chip 104 and the upper semiconductor chip 106.

Figure 11:
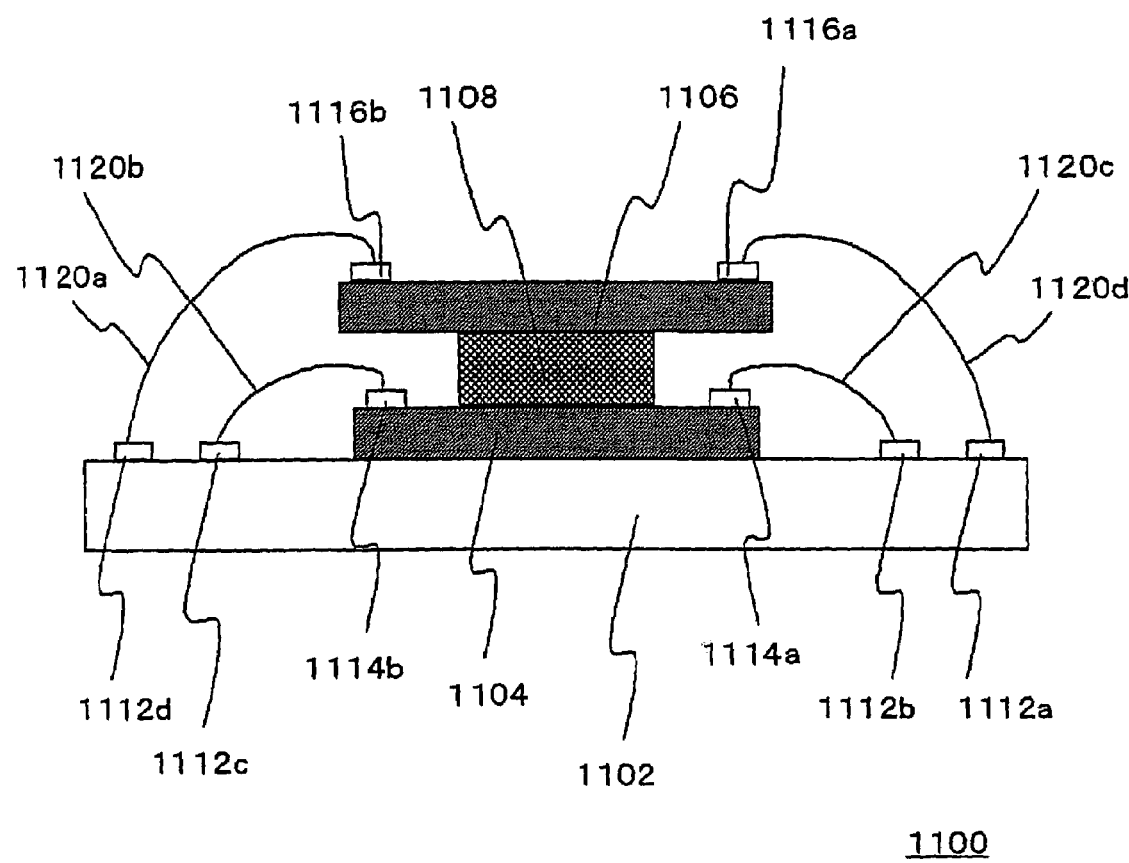
FIG. 11 is a schematic cross-sectional view showing a multi-chip stack structure using conventional silicon spacer.

Thus, unlikely as in the conventional multi-chip stack structure shown in FIG. 11, it is not necessary to have wider interval between the lower semiconductor chip 104 and the upper semiconductor chip 106 for performing the wire bonding.

Accordingly, in the multi-chip stack structure shown in FIG. 1, the silicon spacer 108 may be thinner, and thus the semiconductor device 100 can also be thinner, regardless of the combination of the upper semiconductor chip and the lower semiconductor chip.

Here, in the case of employing the conventional silicon spacer as in the conventional multi-chip stack structure illustrated in FIG. 11, there is a case where the thickness of silicon spacer 1108 should be on the order of 300 μm, for example, since the loop height of Au wire being coupled to the electrode pad of the lower semiconductor chip may be on the order of 250 μm at highest.

On the other hand, for example, thickness of the silicon spacer 108 may be within a range of from 50 μm to 100 μm. Within such range, the silicon spacer 108 can be thinner while providing sufficient rigidity, which allows manufacturing sufficiently thin multi-chip stack structure.

Thus, employing the silicon spacer 108 according to the present embodiment allows providing thinner multi-chip stack structure as compared with the conventional structure.

Such configuration facilitates performing wire bonding free from restriction by a semiconductor chip size, thereby achieving a thin, yet highly integrated semiconductor chip package, which is particularly advantageous for a semiconductor device including a chip-on-chip (COC) structure, multiple chip package (MCP) structure, three-dimensional system in package (SiP) structure or the like.

Figure 12:
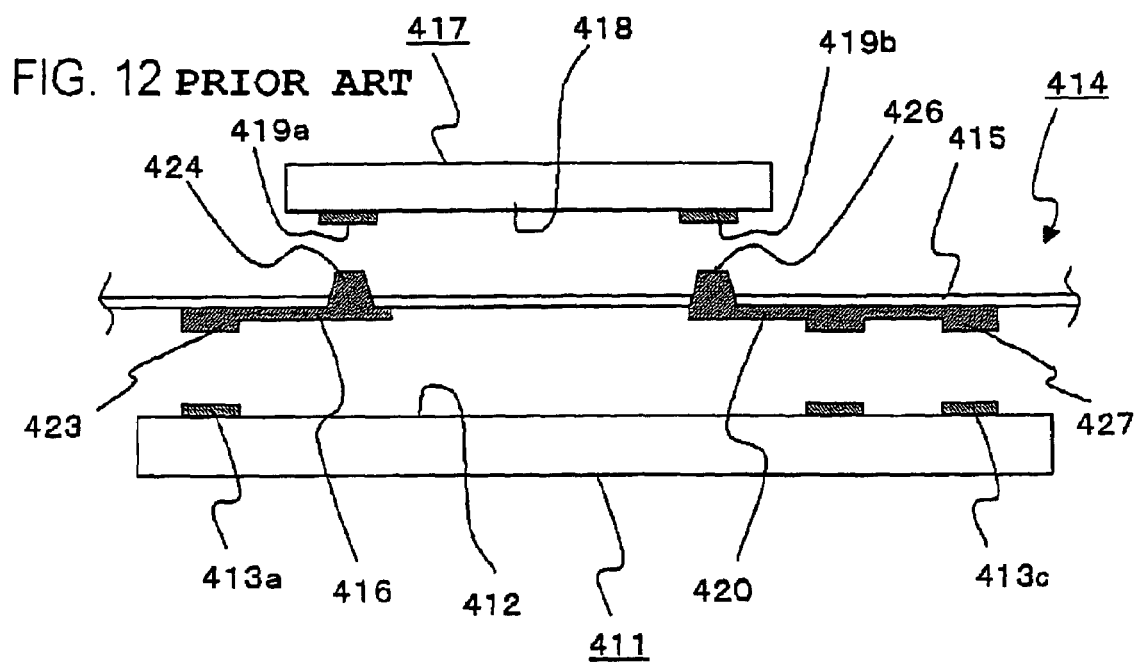
FIG. 12 is a schematic cross-sectional view showing a conventional chip-on-chip structure in which an insulating film is employed.

Here, since the conventional chip-on-chip structure illustrated in FIG. 12 employs a flexible film insulator, it is difficult to form the connection by wire bonding, even though the electrode pad is provided on the film insulator.

On the contrary, since the silicon spacer 108 is the rigid plate-shaped component, wire bonding can be suitably performed with the electrode pads 118a and 118b.

Further, in the case where the lower semiconductor chip 104 and the upper semiconductor chip 106 are both silicon chips as in the multi-chip stack structure illustrated in FIG. 1, the silicon spacer 108 has a linear expansion coefficient that is same level as the lower semiconductor chip 104 and the upper semiconductor chip 106, and thus the differential in the linear expansion coefficients is smaller.

Accordingly, even under the condition of changing the temperature, the semiconductor device 100 provides improved prevention for deterioration of the contact property between the bump electrodes 114a and 114b of the lower semiconductor chip 104 and the through electrodes 128a and 128b, as compared with the conventional chip-on-chip structure shown in FIG. 12. Further, the separation between the silicon spacer 108 and the upper semiconductor chip 106 can also be inhibited.

Figure 9:
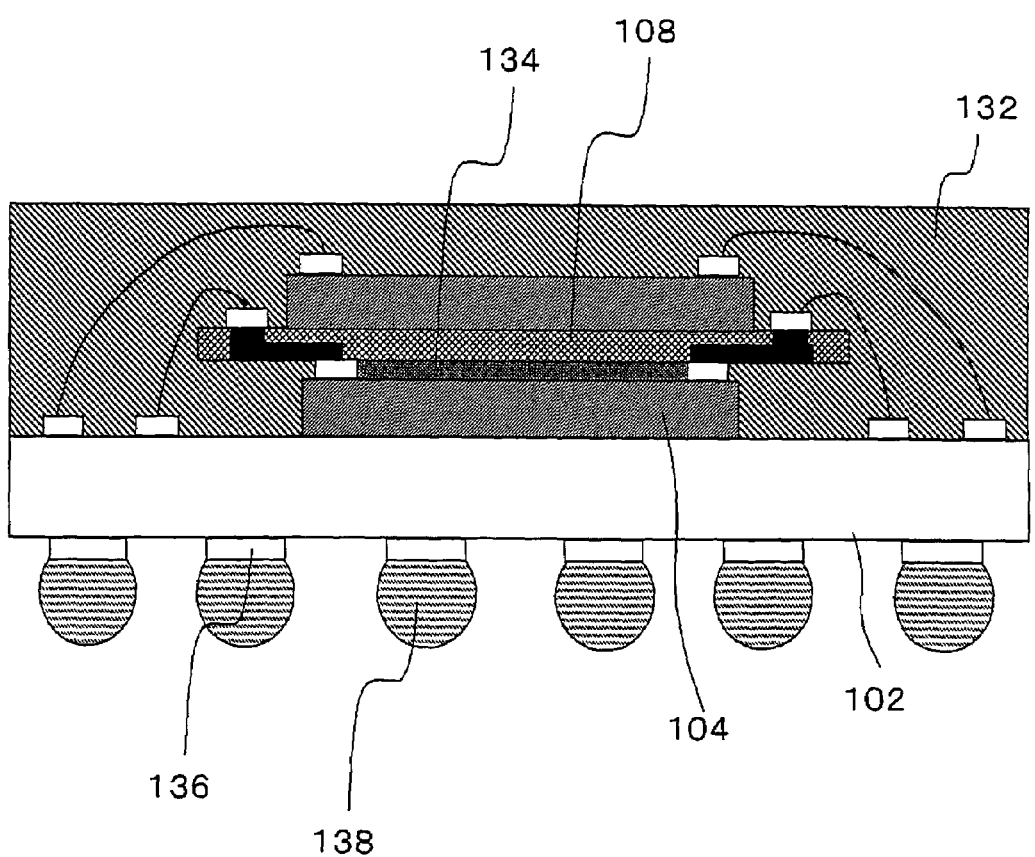
FIG. 9 is a schematic cross-sectional view showing a ball grid alley structure applied to a semiconductor device including the multi-chip stack structure according to the first embodiment.

FIG. 9 is a schematic cross-sectional view showing a semiconductor device including the multi-chip stack structure according to the first embodiment, to which a ball grid alley (BGA) structure is applied.

When applying the BGA structure to the multi-chip stack structure according to this embodiment, electrode pads 136 are provided on the rear surface of the substrate 102, and solder balls 138 are provided on the respective electrode pads 136. The electrode pads 136 may be connected to the electrode pads 112a, 112b, 112c, 112d or the like in FIG. 1, for example.

Also, an entirety of the multi-chip stack structure is sealed with a sealing resin layer 132. Here, a gap between the lower semiconductor chip 104 and the silicon spacer 108 illustrated in FIG. 1 is sealed with an underfilling resin layer 134.

FIGS. 2A to 2C and FIG. 3D to 3E are schematic cross-sectional views, sequentially showing a manufacturing process of the multi-chip stack structure according to the first embodiment.

Figure 2A:
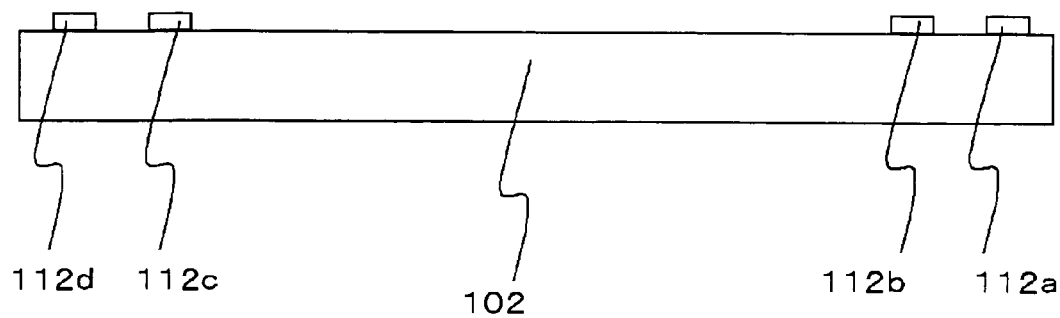
FIGS. 2A to 2C are schematic cross-sectional views sequentially showing a manufacturing process for the multi-chip stack structure according to the first embodiment.

For obtaining the multi-chip stack structure according to the first embodiment, the electrode pads 112a, 112b, 112c, 112d are first formed on the substrate 102, as shown in FIG. 2A.

Figure 2B:
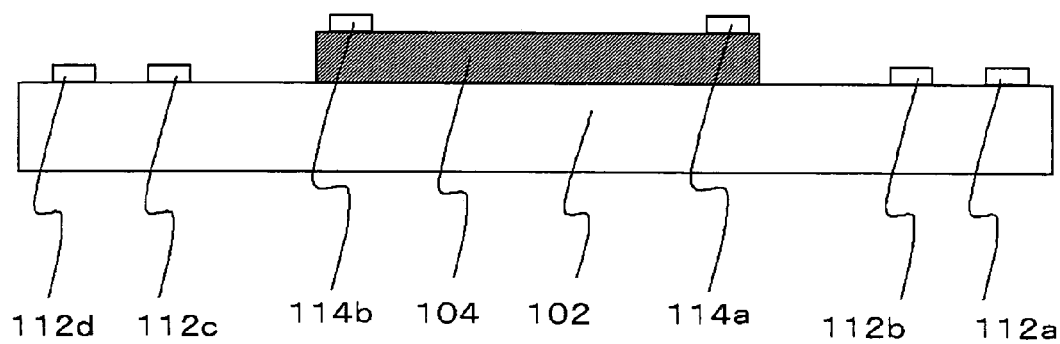

Then the lower semiconductor chip 104 is stacked on the upper surface of the substrate 102, as shown in FIG. 2B. The semiconductor chip 104 is provided with the bump electrodes 114a and 114b formed in advance on the upper surface thereof.

Figure 2C:
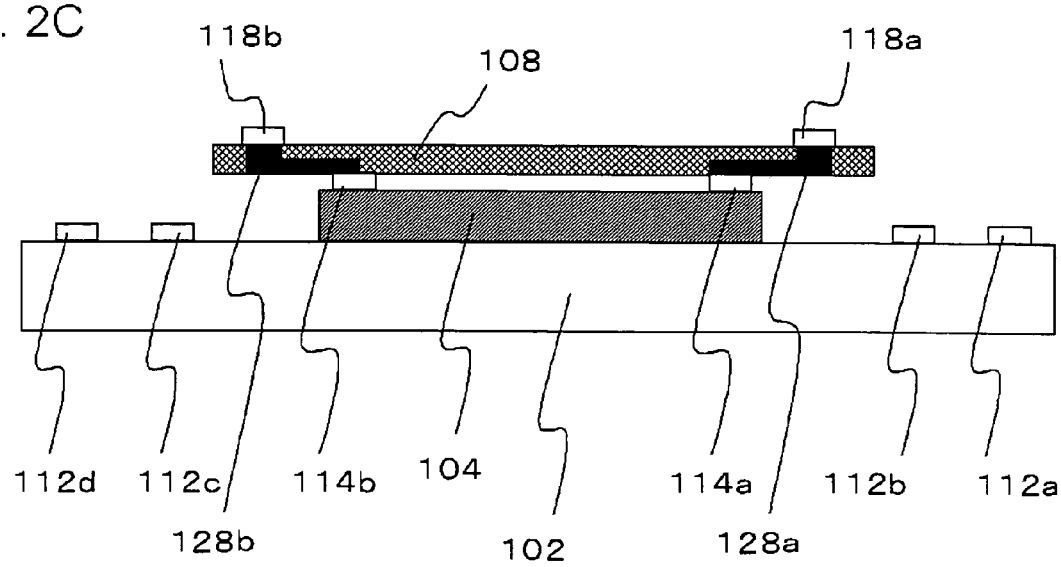

The silicon spacer 108 is then stacked on the semiconductor chip 104 as shown in FIG. 2C. On the silicon spacer 108, the through electrodes 128a and 128b are formed to provide connections with the bump electrodes 114a and 114b on the upper surface of the lower semiconductor chip 104, through the through electrodes 128a and 128b, using a technique that will be described later. In addition, the electrode pads 118a and 118b are provided in advance on the upper surface of the silicon spacer 108.

Figure 3D:
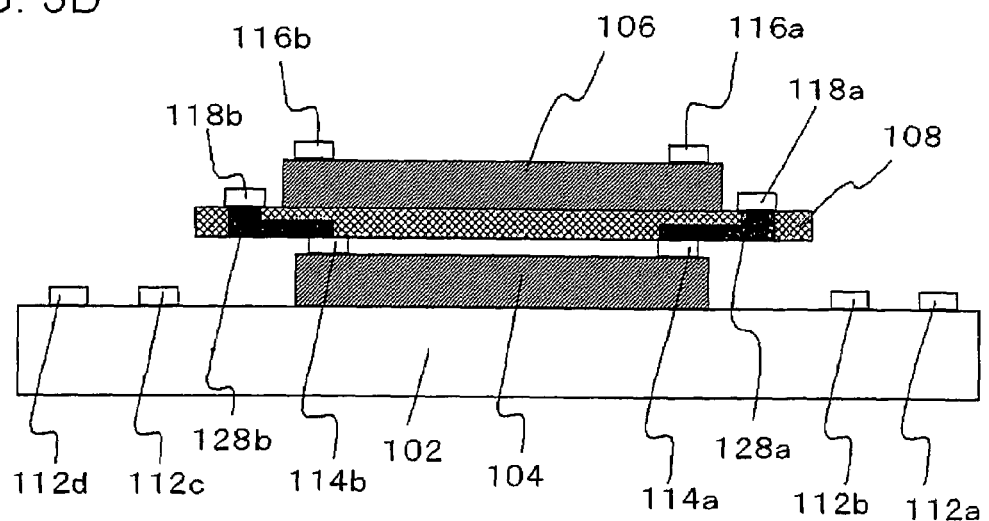
FIGS. 3D and 3E are schematic cross-sectional views sequentially showing the manufacturing process for the multi-chip stack structure according to the first embodiment.

Thereafter, as shown in FIG. 3D, the upper semiconductor chip 106 is stacked on the silicon spacer 108. On the upper surface of the upper semiconductor chip 106, the electrode pads 116a and 116b are provided in advance.

Figure 3E:
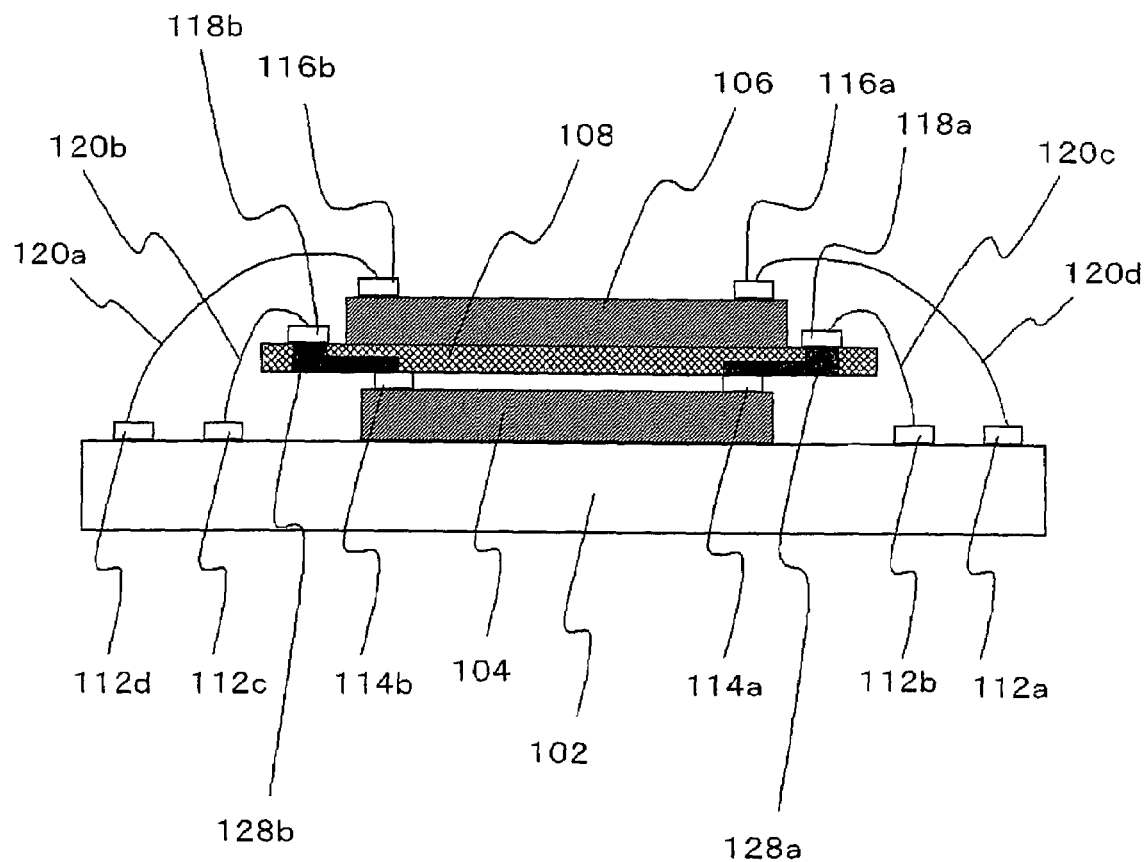

Then, wire bonding is performed as shown in FIG. 3E. More specifically, the electrode pads 118a and 118b on the upper (outer) surface of the silicon spacer 108 are connected via wire bonding to the electrode pads 112b and 112c on the substrate 102 respectively. In addition, the electrode pads 116a and 116b on the upper surface of the upper semiconductor chip 106 are connected via wire bonding to the electrode pads 112a and 112d on the substrate 102, respectively.

According to such process, the silicon spacer 108 maybe thinner, and therefore thinner semiconductor device 100 can also be stably manufactured, regardless of the combination of the upper semiconductor chip and the lower semiconductor chip.

Further, the silicon spacer 108 is a rigid plate-shaped component, and wire bonding to the electrode pads 118a and 118b can be suitably performed.

Figure 8A:
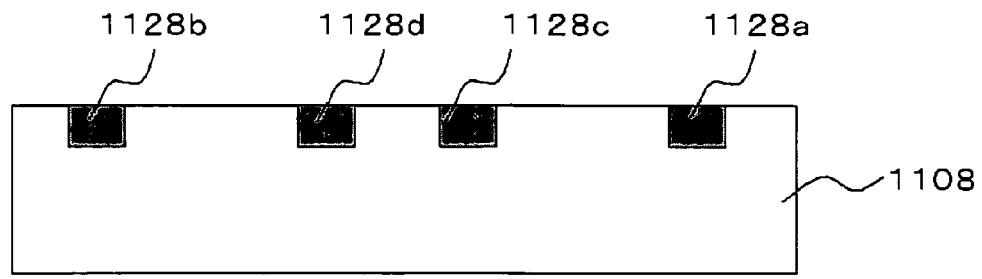
FIGS. 8A to 8C are schematic cross-sectional views sequentially showing a manufacturing process for the through electrode according to the first embodiment.
Figure 8B:
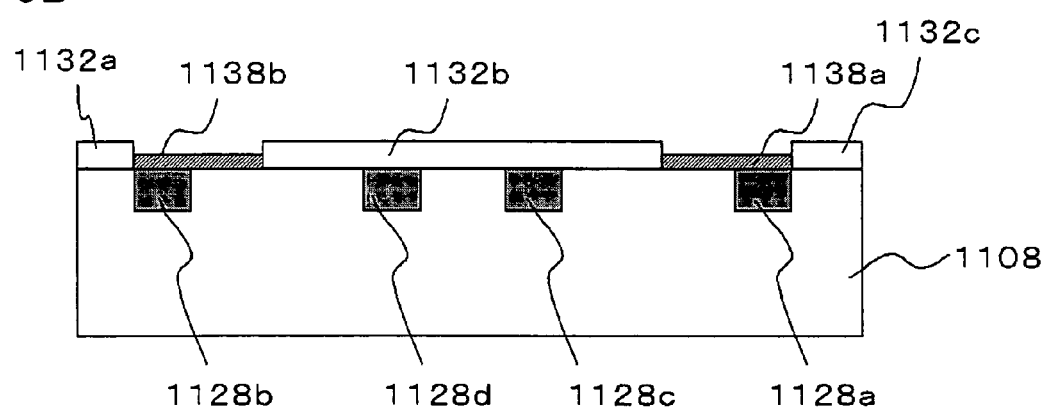
Figure 8C:
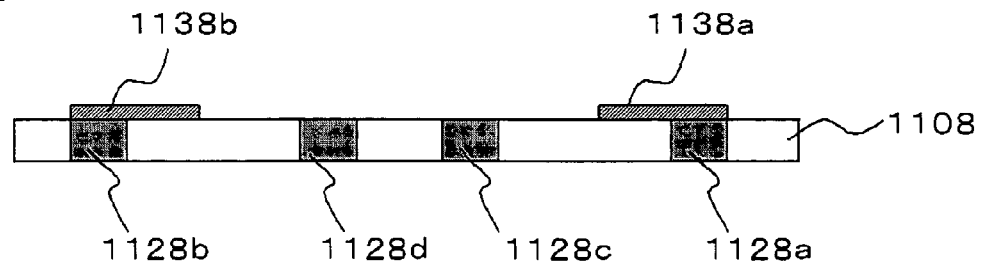

FIGS. 8A to 8C are schematic cross-sectional views sequentially showing a manufacturing process of the through electrode according to the first embodiment. Here, the top sides in FIGS. 8A to 8C correspond to the rear surfaces (bottom side in FIG. 1) of the silicon spacer 108.

For forming the through electrode in the silicon spacer 108 illustrated in the first embodiment, firstly a resist film (not shown in the drawings) is provided on the silicon spacer 1108, and selective etching is performed on the silicon spacer 1108 utilizing the resist film as a mask, so as to form recessed portions on the rear surface of the silicon spacer 1108. Then, the recessed portions are filled with conductive materials 1128a, 1128b, 1128c and 1128d, as shown in FIG. 8A.

The conductive material may be a metal material containing, for example, Al, Cu or the like. Such conductive material may be formed by, for example, plating technique. In addition, the conductive material may be provided with a barrier metal film constituted of TiN or the like, on a bottom face and on a side face of the barrier metal film.

Then, as shown in FIG. 8B, resist films 1132a, 1132b and 1132c are formed on the rear surface of the silicon spacer 1108. The resist films have openings on the upper surface of the conductive materials 1128a and 1128b and regions adjacent thereof. Subsequently, conductive materials 1138a and 1138b are formed in these openings with, for example, sputtering technique or the like.

Subsequently, as shown in FIG. 8C, the resist films 1132a, 1132b and 1132c are stripped from the rear surface of the silicon spacer 1108. Then, the front surface side of the silicon spacer 1108 is polished (back-grind) to reduce the thickness of the silicon spacer 1108 down to approximately 50 to 100 μm.

As a result, end portions in the front surface side of the conductive materials 1128a, 1128b, 1128c and 1128d are exposed to form the through electrodes. After the polishing, the front surface side of the silicon spacer 1108 is finishing-polished to obtain the silicon spacer 1108 provided with the through electrodes and the reroutings.

In the first embodiment, the electrode pad on the upper surface of the lower semiconductor chip can be drawn out to the electrode pad on the upper (outer) surface of the silicon spacer with the rerouting via the through electrode and the rerouting, by employing such silicon spacer 1108 provided with the through electrodes and the reroutings as the silicon spacer having the rerouting.

Thus, the semiconductor device comprising the multi-chip stack structure having sufficiently reduced thickness and being highly flexible in routing arrangement is offered by employing the silicon spacer with the rerouting having such configuration.

Second Embodiment

An embodiment for forming two-levels stack of a semi-conductor chip in a face down configuration will be described as follows.

Figure 4:
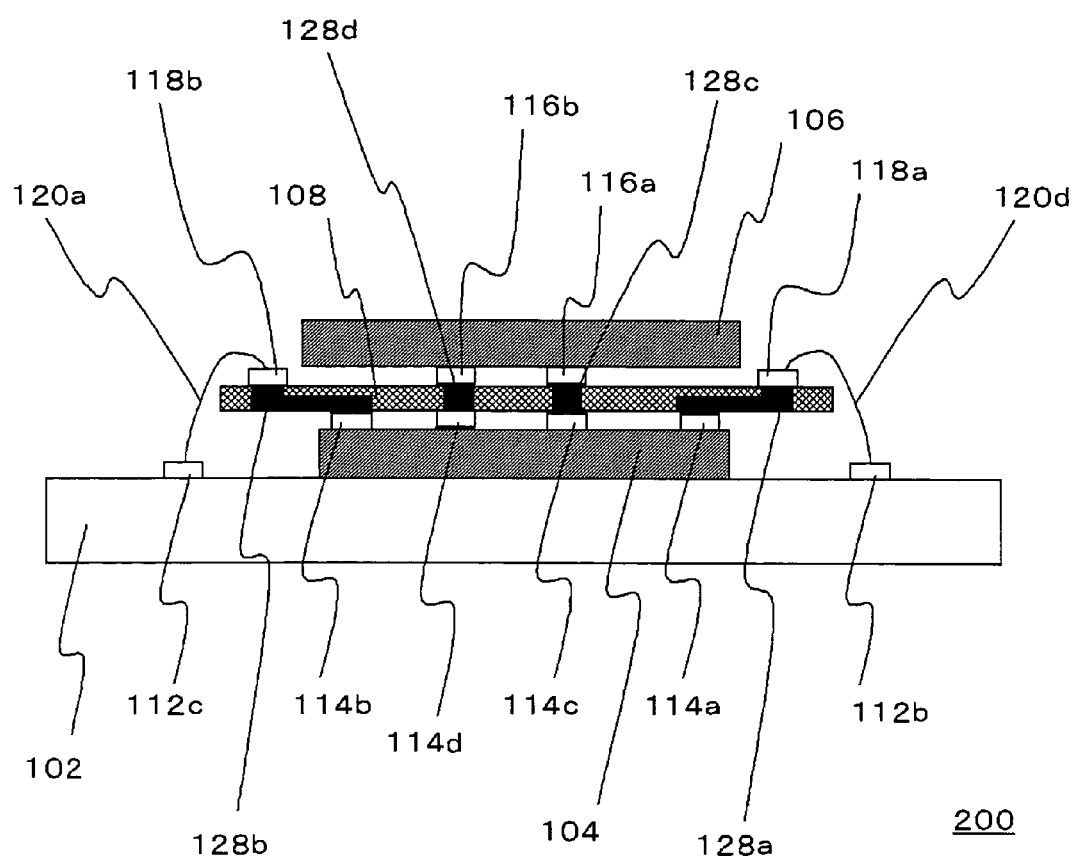
FIG. 4 is a schematic cross-sectional view showing a multi-chip stack structure according to a second embodiment.

FIG. 4 is a cross sectional view showing a multi-chip stack structure of the second embodiment.

A multi-chip stack structure according to the second embodiment has a similar configuration to that in the first embodiment, though the through electrodes 128c and 128d are provided in the silicon spacer 108. The lower semiconductor chip 104 and the upper semiconductor chip 106 has a configuration of utilizing the bump electrodes 114c and 114d and the bump electrodes 116a and 116b, respectively, to provide connections in a face down configuration via the through electrodes 128c and 128d of the silicon spacer 108.

More specifically, a semiconductor device 200 includes a substrate 102, on which a semiconductor chip 104 and a semiconductor chip 106 are provided. Between the semiconductor chip 104 and the semiconductor chip 106, a silicon spacer 108 is interposed.

Here, a kinds or natures of the semiconductor chip 104 and the semiconductor chip 106 is not specifically limited, and a silicon chip constituted of a similar material to that of the silicon spacer 108 may be employed.

The substrate 102 is provided with electrode pads 112b and 112c on an upper surface thereof. The semiconductor chip 104 is provided with electrode pads 114a, 114b, 114c and 114d on an upper surface thereof. The semiconductor chip 106 is provided with bump electrodes 116a and 116b on a lower surface thereof.

The silicon spacer 108 includes through electrodes 128a, 128b, 128c and 128d penetrating the silicon spacer 108. On an upper surface of the silicon spacer 108, electrode pads 118a and 118b are provided. The electrode pad 118a is connected to an upper (outer) end portion of the through electrode 128a. The electrode pad 118b is connected to an upper (outer) end portion of the through electrode 128b.

The bump electrodes 114a and 114b of the lower semiconductor chip 104 are directly connected to the lower (inner) end portions of the through electrodes 128a and 128b of the silicon spacer 108, respectively.

The bump electrodes 114c and 114d of the lower semiconductor chip 104 are directly connected to the lower end portions of the through electrodes 128c and 128d of the silicon spacer 108, respectively.

The electrode pads 118a and 118b of the silicon spacer 108 are connected to the electrode pad 112b and 112c provided on the upper surface of the substrate 102 via wires 120d and 120a, respectively.

The bump electrode 116a and 116b of the semiconductor chip 106 are connected in a face down configuration directly to the through electrodes 128c and 128d of the silicon spacer 108, respectively.

According to such configuration, the bump electrodes 114a and 114b provided on the upper surface of the lower semiconductor chip 104 can be drawn out to the electrode pads 118a and 118b provided on the upper side (outside) of the silicon spacer 108 through the through electrodes 128a and 128b provided on the silicon spacer 108, respectively.

Accordingly, wire bonding onto the lower semiconductor chip 104 can be performed via the electrode pad 118a and 118b on the silicon spacer 108, which has larger dimension than the lower semiconductor chip 104 and the upper semiconductor chip 106.

Thus, unlikely as in the conventional multi-chip stack structure shown in FIG. 11, it is not necessary to have wider interval between the lower semiconductor chip 104 and the upper semiconductor chip 106 for performing the wire bonding.

Accordingly, in the multi-chip stack structure shown in FIG. 4, the silicon spacer 108 may be thinner, and thus the semiconductor device 100 can also be thinner, regardless of the combination of the upper semiconductor chip and the lower semiconductor chip.

A thickness of the silicon spacer 108 may be in a range of 50 μm to 100 μm, for example. Within such range, the silicon spacer 108 can be thinner while providing sufficient rigidity, which allows manufacturing sufficiently thin multi-chip stack structure.

Such configuration facilitates performing wire bonding free from restriction by a semiconductor chip size, thereby achieving a thin, yet highly integrated semiconductor chip package, which is particularly advantageous for a semiconductor device including a COC, MCP, three-dimensional SiP structures or the like.

Further, since such configuration eliminates the need for performing wire bonding onto the upper semiconductor chip 106, the thickness is reduced by the dimension corresponding to the wire, and therefore the whole thickness of the multi-chip stack structure can be more thinner, thereby presenting more smaller package. In addition, since the lower semiconductor chip 104 and the upper semiconductor chip 106 are connected in the face down configuration, the signal path length between two chips is reduced to provide improved signal transmission speed, and thus the characteristics of the upper semiconductor chip and lower semiconductor chip can be more efficiently exhibited.

Here, since the conventional chip-on-chip structure illustrated in FIG. 12 employs the flexible film insulator, it is difficult to form the connection by wire bonding, even though the electrode pad is provided on the film insulator.

On the contrary, since the silicon spacer 108 is the rigid plate-shaped component, wire bonding can be suitably performed on the electrode pads 118a and 118b.

Further, in the case where the lower semiconductor chip 104 and the upper semiconductor chip 106 are both silicon chips as in the multi-chip stack structure illustrated in FIG. 4, the silicon spacer 108 has a linear expansion coefficient that is same level as the lower semiconductor chip 104 and the upper semiconductor chip 106, and thus the differential in the linear expansion coefficients is smaller.

Accordingly, even under the condition of changing the temperature, the semiconductor device 100 provides improved prevention for deterioration of the contact property between the bump electrodes 114a and 114b of the lower semiconductor chip 104 and the through electrodes 128c and 128d, as compared with the conventional chip-on-chip structure shown in FIG. 12. Further, the deterioration in the contact property between the bump electrodes 116a and 116b of the upper semiconductor chip and the through electrodes 128c and 128d can be prevented.

Figure 5:
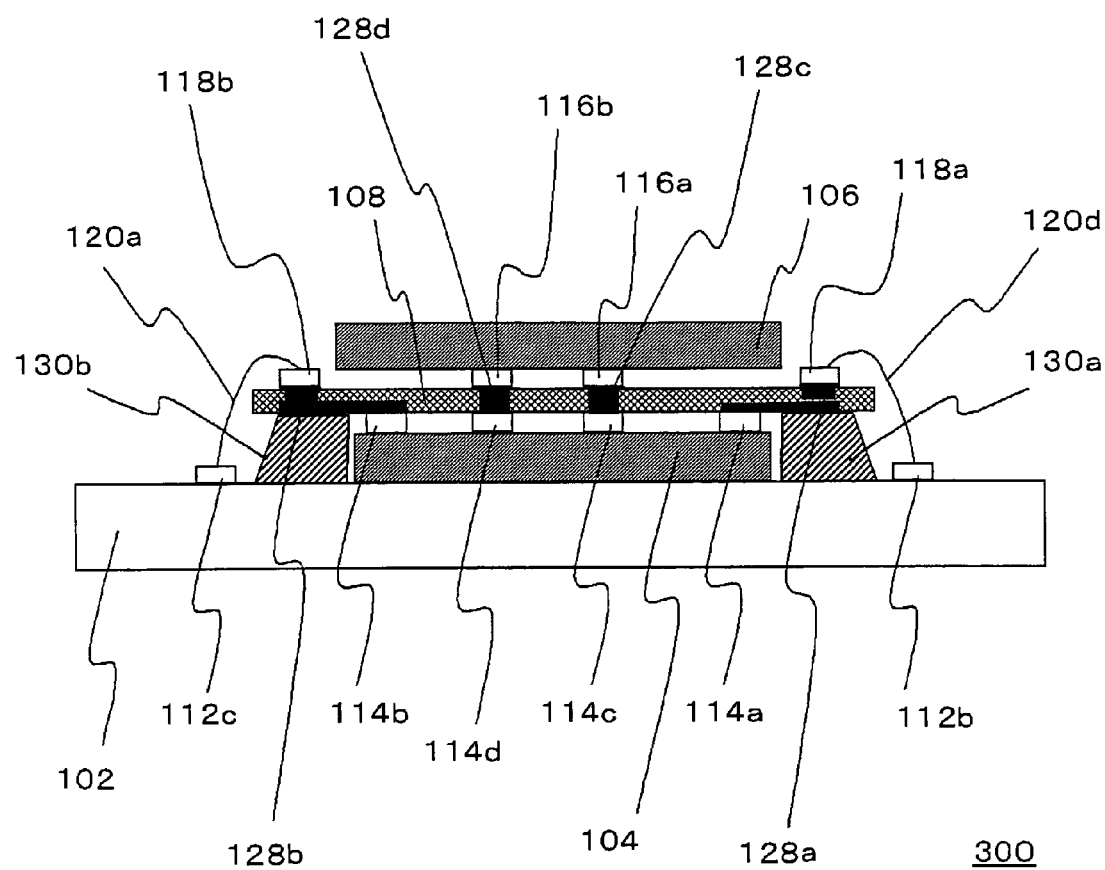
FIG. 5 is a schematic cross-sectional view showing a multi-chip stack structure according to a modified example of the second embodiment.

FIG. 5 is a schematic cross-sectional view, illustrating a multi-chip stack structure according to a modified example of the second embodiment.

A semiconductor device 300 having a multi-chip stack structure according to the modified example has a similar configuration to the multi-chip stack structure according to the second embodiment, except that reinforcing components 130a and 130b for supporting the silicon spacer 108 are provided between the substrate 102 and the silicon spacer 108.

As in such configuration, the reinforcing components 130a and 130b for supporting the protruding portion of the silicon spacer 108 can be formed as required, when the electrode pads 118a and 118b for wire bonding on the silicon spacer 108 and the electrode pads 112b and 112c on the upper surface of the substrate 102 are being connected via wire bonding. Reinforcing components 130a, 130b may be formed by, for example, injecting a resin with a dispenser or the like and curing thereof.

It is understood in this configuration that wire bonding to the thinner silicon spacer 108 can more easily be performed by forming the reinforcing components 130a and 130b as required.

Figure 10:
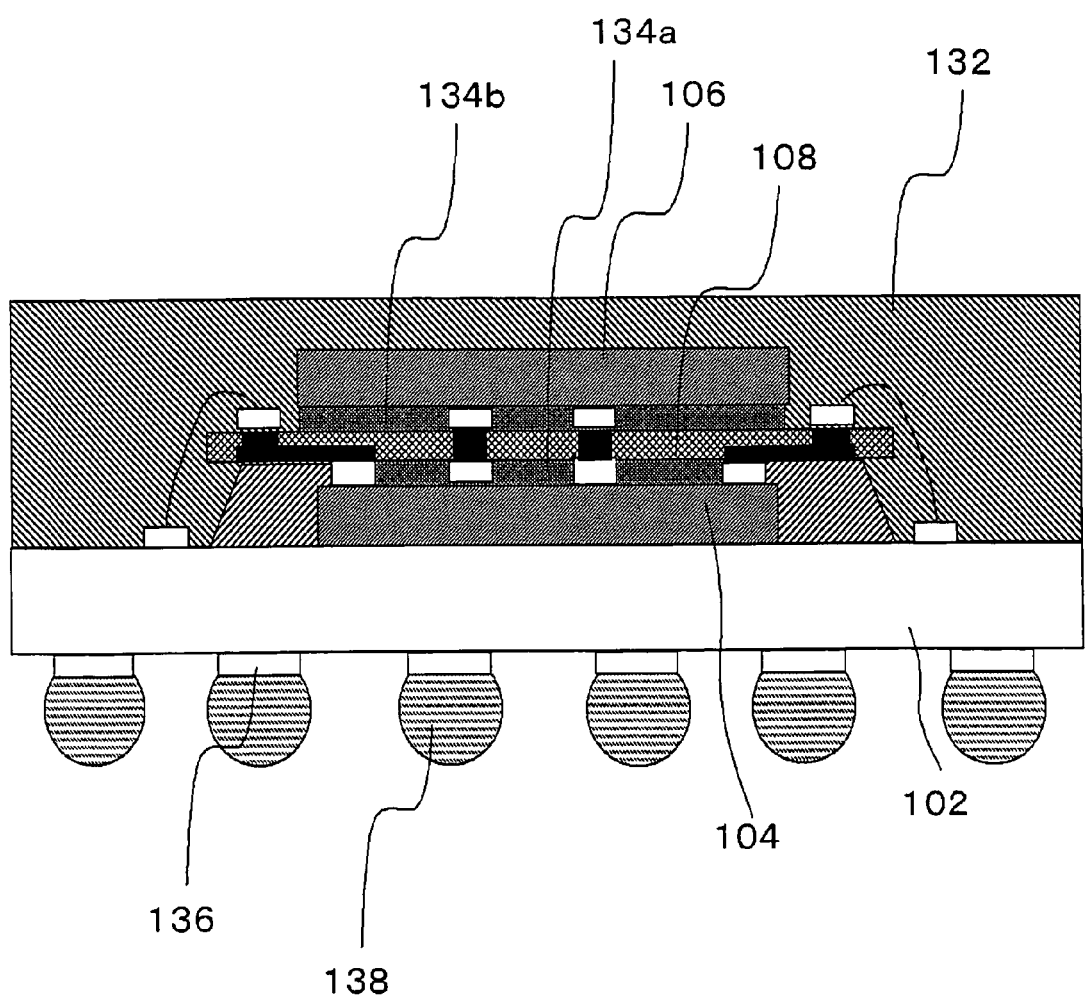
FIG. 10 is a schematic cross-sectional view showing a ball grid alley structure applied to a semiconductor device including the multi-chip stack structure according to the second embodiment.

FIG. 10 is a schematic cross-sectional view showing a semiconductor device including a multi-chip stack structure according to the second embodiment, to which a ball grid alley (BGA) structure is applied.

When applying a BGA structure to the multi-chip stack structure according to this embodiment, electrode pads 136 are provided on a rear surface of the substrate 102, and solder balls 138 are provided on the respective electrode pads 136. The electrode pads 136 may be have a configuration that is connected to the electrode pads 112b, 112c or the like in FIG. 5, for example.

Also, an entirety of the multi-chip stack structure is sealed with a sealing resin layer 132. Here, a gap between the lower semiconductor chip 104 shown in FIG. 5 and the silicon spacer 108 is sealed with an underfilling resin layer 134a. In addition, a gap between the upper semiconductor chip 106 shown in FIG. 5 and the silicon spacer 108 is sealed with an underfilling resin layer 134b.

FIGS. 6A to 6C and FIG. 7D are schematic cross-sectional views sequentially showing a manufacturing process for the multi-chip stack structure according to the second embodiment. Although the method for manufacturing the modified example thereof having the reinforcing component will be described as follows, an alternative configuration of being free of the reinforcing component may also be employed according to the present invention.

Figure 6A:
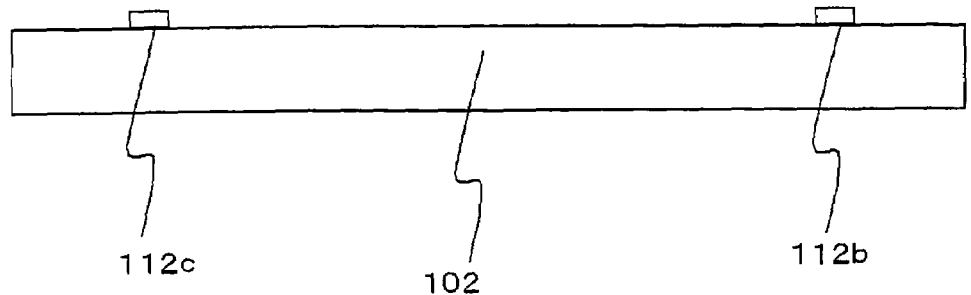
FIGS. 6A to 6C are schematic cross-sectional views sequentially showing a manufacturing process for the multi-chip stack structure according to the second embodiment.

For obtaining the multi-chip stack structure according to the second embodiment, the electrode pads 112b and 112c are first formed on the substrate 102, as shown in FIG. 6A.

Figure 6B:
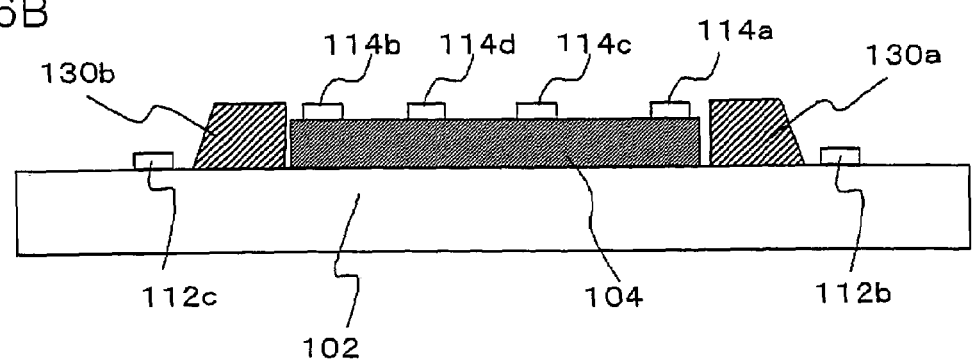

Then the lower semiconductor chip 104 is stacked on the upper surface of substrate 102, as shown in FIG. 6B. The semiconductor chip 104 is provided with the bump electrodes 114a, 114b, 114c and 114d formed in advance on the upper surface of the semiconductor chip 104. Moreover, the reinforcing components 130a and 130b are provided on the upper surface of the substrate 102.

Figure 6C:
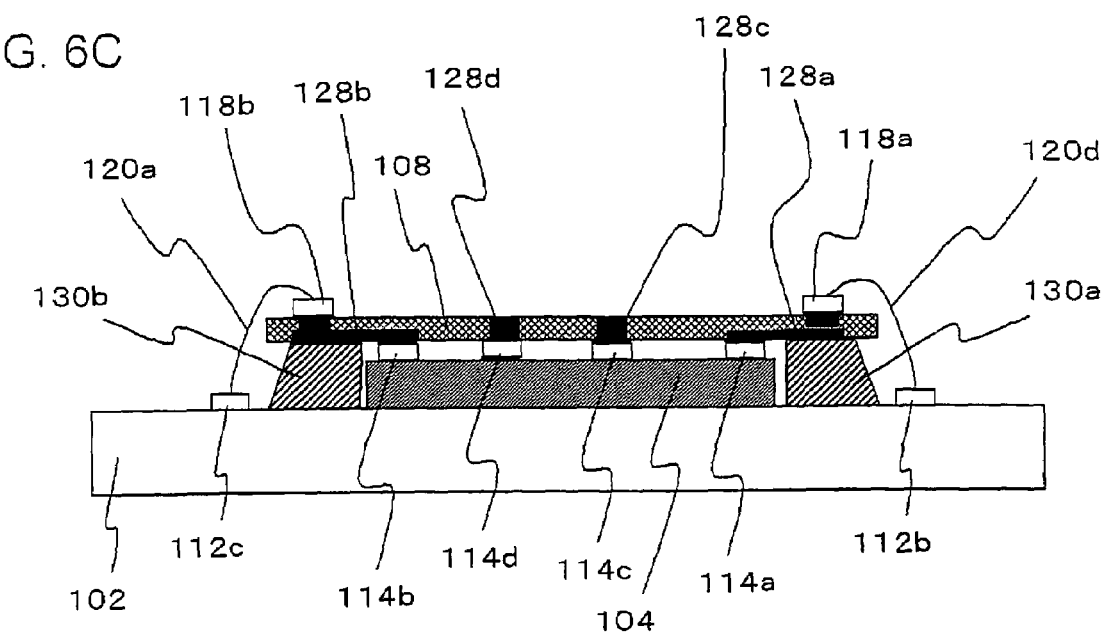

Subsequently, as shown in FIG. 6C, the silicon spacer 108 is stacked on an upper surface of the semiconductor chip 104. The silicon spacer 108 is provided with the through electrode 128a, 128b, 128c and 128d in advance, which are connected to the bump electrodes 114a 114b, 114c and 114d on the upper surface of the lower semiconductor chip 104, through the through electrodes 128a, 128b, 128c and 128d.

In addition, on the upper surface of the silicon spacer 108, the electrode pads 118a and 118b are provided in advance. The protruding portion of the silicon spacer 108 is supported by the reinforcing components 130a and 130b.

Then, the electrode pads 118a and 118b on the upper surface of the silicon spacer 108 are connected via wire bonding to the electrode pads 112b and 112c on the upper surface of the substrate 102.

In this occasion, the presence of the reinforcing components 130a and 130b improves the strength on a silicon spacer 108, and thus wire bonding for the electrode pads 118a and 118b can easily be performed.

Figure 7D:
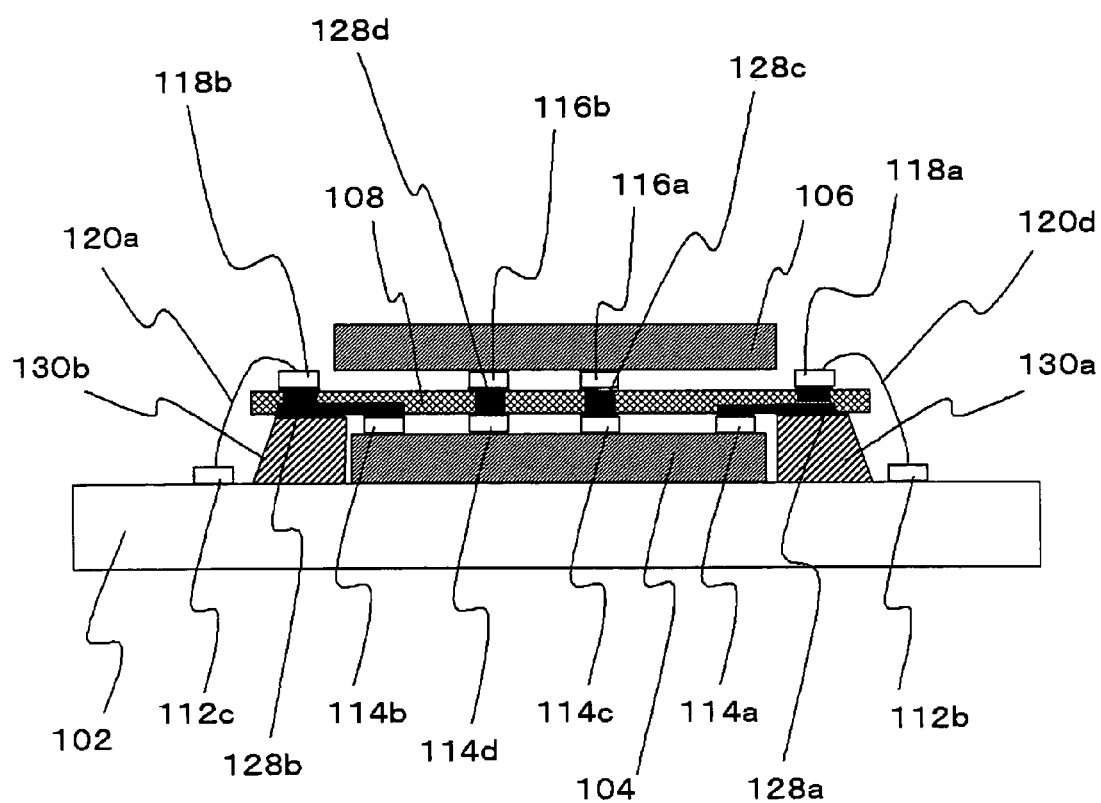
FIG. 7D is a schematic cross-sectional view sequentially showing the manufacturing process for the multi-chip stack structure according to the second embodiment.

Thereafter, as shown in FIG. 7D, the upper semiconductor chip 106 is stacked on the silicon spacer 108 in a face down connection. On the lower surface of the upper semiconductor chip 106, the electrode pads 116a and 116b are provided in advance. Bump electrodes 116a and 116b of the upper semiconductor chip 106 are directly connected to the upper end portions of the through electrodes 128c and 128d of the silicon spacer 108, respectively.

According to such process, the silicon spacer 108 maybe thinner than the silicon spacer included in the semiconductor device described in JP-A Laid Open No. 2003-101,000, and therefore semiconductor device 300 having reduced thickness can also be stably manufactured, regardless of the combination of the upper semiconductor chip and the lower semiconductor chip.

Further, since the lower semiconductor chip 104 and the upper semiconductor chip 106 are connected in a face down connection, the semiconductor device 300 comprising the multi-chip stack structure having reduced total thickness and further improved signal transmission speed between two chips can be stably manufactured.

In addition, the silicon spacer 108 is rigid, due to its plate-shape. The presence of the reinforcing components 130a and 130b further improves the strength of the silicon spacer 108, and thus the semiconductor device 300 can be manufactured with improved dimensional stability even in the case of performing wire bonding for the electrode pads 118a and 118b.

While the aspects of present invention have been described as above, it is to be understood that any combination of such aspects is also included in the scope of the present invention. In addition, any conversion of the expressions included in the present invention into another category is also duly included in the scope of the present invention.

For example, while the foregoing embodiments provide the plate-shaped spacer constituted of the single-piece material, it is not intended to particularly limit the scope of the invention thereto. For example, the spacer may be constituted of two plates connected to each other, or of a plurality of plate-shaped spacers aligned at certain intervals.

With such configuration, it is equally possible to draw out the electrode pad disposed on the upper surface of the first semiconductor chip to a position farther outward than the outer periphery of the first semiconductor chip via the interconnect provided on the spacer.

Although the foregoing embodiments employ the silicon spacer as the plate-shaped spacer, it is not intended to particularly limit thereto. For example, a plate-shaped spacer comprising another semiconductor material may be employed, or a plate-shaped spacer comprising a resin compound may be employed. Meanwhile, a plate-shaped spacer, which is superior in rigidity to the insulating film employed in the COC structure shown in FIG. 12, preferably provides a more advantageous effect in the wire bonding, and thereby increases the manufacturing stability of the multi-chip stack structure.

Even in such materials may be selected to constitute the spacer, the spacer can be prevented from being bent or inclined of the spacer when performing wire bonding on a outer end portion thereof, as long as the selected material has certain rigidity.

Further, the foregoing embodiment employs a wire bonding technique for connecting, it is not intended to particularly limit thereto. Alternatively, for example, a configuration may also be employed, where an interconnect provided on the lower surface of the plate-shaped spacer is directly connected to an electrode pad on a substrate.

Even in such alternative configuration, the electrode pad on the upper surface of the first semiconductor chip can be drawn out via the interconnect provided in the spacer to provide a connection with the electrode pad on the substrate.

Figure 13:
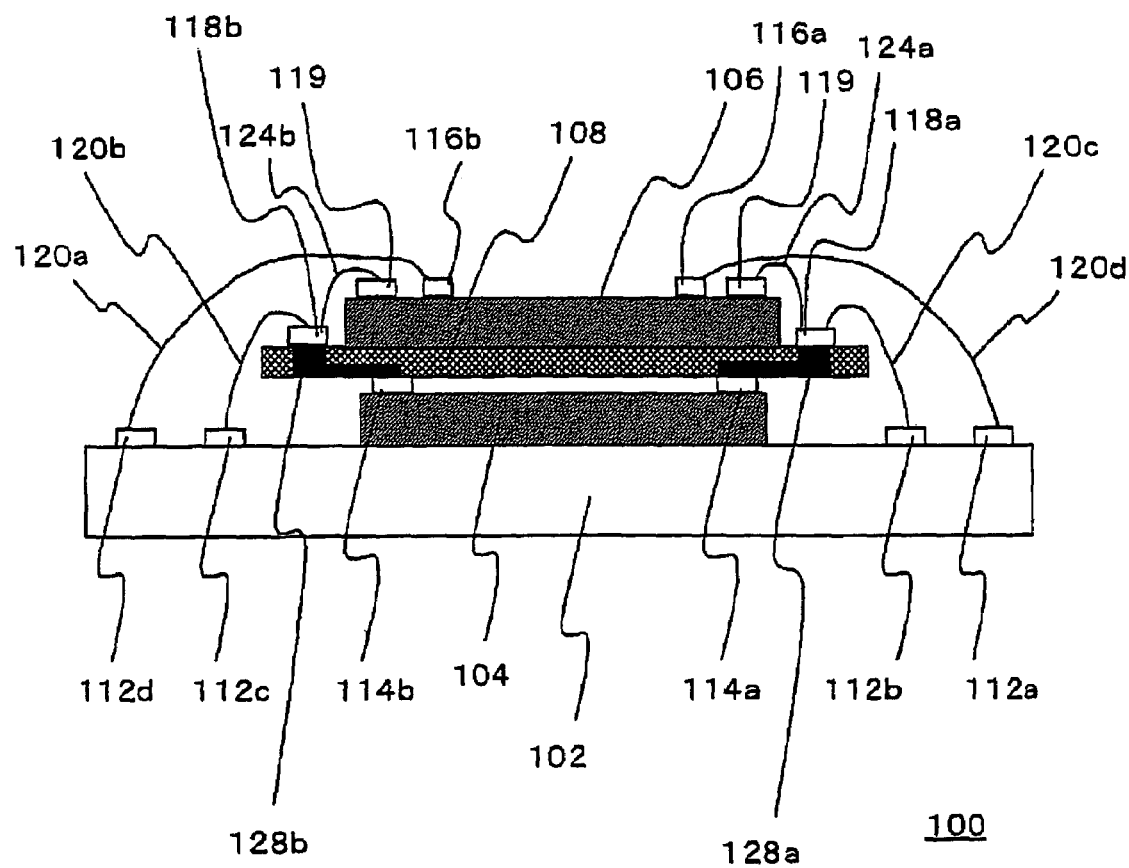
FIG. 13 is a schematic cross-sectional view showing a multi-chip stack structure according to a modified example of the first embodiment.

Further, as shown in FIG. 13, in the semiconductor device 100, electrode pads 119 are provided on the semiconductor chip 106 and are connected to the electrode pad 118a, 118b via a wire 124a, 124b respectively. Having such configuration, the semiconductor device 100 may have a shorter wire length, thereby providing improved signal transmission speed. In addition, since the shorter length of the wire can be employed, the width of the semiconductor device 100 can be reduced.

It is apparent that the present invention is not limited to the above embodiment, that may be modified and changed without departing from the scope and spirit of the invention.

What is claimed is:

1. A semiconductor device, comprising:
   a substrate;
   a first semiconductor chip provided on said substrate;
   a second semiconductor chip provided on said first semiconductor chip; and
   a plate-shaped spacer formed between said first semiconductor chip and said second semiconductor chip, and including a protruding portion protruding farther outward than an outer periphery of said first semiconductor chip,
   wherein a first electrode pad is provided on said first semiconductor chip,
   wherein said spacer includes a second electrode pad provided on said protruding portion and an interconnect that connects said first electrode pad and said second electrode pad, and
   wherein a third electrode pad is provided on an upper surface of said first semiconductor chip, wherein a fourth electrode pad is provided on a lower surface of said second semiconductor chip, and wherein said spacer includes an interconnect that connects said third electrode pad and said fourth electrode pad.

2. The semiconductor device according to claim 1, wherein said interconnect of said spacer includes a through electrode that penetrates said spacer.

3. The semiconductor device according to claim 1, wherein said second electrode pad is provided farther outward than an outer periphery of said second semiconductor chip.

4. The semiconductor device according to claim 1, wherein said second electrode pad is provided on said protruding portion.

5. The semiconductor device according to claim 1, wherein said spacer is a silicon substrate.

6. The semiconductor device according to claim 1, wherein said second electrode pad is connected via wire bonding.

7. The semiconductor device according to claim 1, further comprising a reinforcing component formed on said substrate, for sustaining said spacer at said protruding portion.

8. The semiconductor device according to claim 6, wherein a third electrode is provided on an upper surface of said substrate, and wherein said second electrode pad is connected to said third electrode pad with wire bonding.

* * * * *